United States Patent
Donoghue et al.

(10) Patent No.: US 11,121,321 B2
(45) Date of Patent: Sep. 14, 2021

(54) HIGH RESOLUTION SHADOW MASK WITH TAPERED PIXEL OPENINGS

(71) Applicant: eMagin Corporation, Hopewell Junction, NY (US)

(72) Inventors: Evan P. Donoghue, Hopewell Junction, NY (US); Ilyas I. Khayrullin, Hopewell Junction, NY (US); Kerry Tice, Hopewell Junction, NY (US); Tariq Ali, Hopewell Junction, NY (US); Qi Wang, Hopewell Junction, NY (US); Fridrich Vazan, Pittsford, NY (US); Amalkumar P. Ghosh, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 16/178,388

(22) Filed: Nov. 1, 2018

(65) Prior Publication Data

US 2019/0131528 A1    May 2, 2019

Related U.S. Application Data

(60) Provisional application No. 62/580,274, filed on Nov. 1, 2017.

(51) Int. Cl.
| | | |
|---|---|---|
| *C23C 14/04* | (2006.01) | |
| *C23C 14/24* | (2006.01) | |
| *H01J 1/62* | (2006.01) | |
| *B23K 26/364* | (2014.01) | |
| *H01L 51/00* | (2006.01) | |
| *H01L 51/56* | (2006.01) | |
| *H01L 27/32* | (2006.01) | |

(52) U.S. Cl.
CPC ........ *H01L 51/0011* (2013.01); *C23C 14/042* (2013.01); *H01L 27/3244* (2013.01); *H01L 51/001* (2013.01); *H01L 51/56* (2013.01)

(58) Field of Classification Search
CPC ................. H01L 51/56; H01L 27/3216; H01L 2227/323
See application file for complete search history.

(56) References Cited

U.S. PATENT DOCUMENTS

| | | | | |
|---|---|---|---|---|
| 9,108,216 B2* | 8/2015 | Hirobe | ................ | H01L 51/0011 |
| 2002/0036456 A1* | 3/2002 | Komatsu | ................ | H01J 29/07 |
| | | | | 313/402 |
| 2009/0253336 A1* | 10/2009 | Ito | .......................... | H01L 51/56 |
| | | | | 445/58 |
| 2010/0033084 A1* | 2/2010 | Ko | ...................... | H01L 27/3246 |
| | | | | 313/504 |

(Continued)

FOREIGN PATENT DOCUMENTS

WO    WO-2018188566 A1 * 10/2018    ......... H01L 27/3246

OTHER PUBLICATIONS

Machine translation of WO 2018188566 A1 (Year: 2018).*

*Primary Examiner* — Brian Turner

(74) *Attorney, Agent, or Firm* — Kaplan Breyer Schwarz, LLP

(57) ABSTRACT

Aspects of the present disclosure are directed to systems, method, and structures including a high-resolution shadow mask with tapered aperture/pixel openings that advantageously overcomes problems plaguing the prior art namely shadowing, sagging, and fragility.

19 Claims, 5 Drawing Sheets

(56) References Cited

U.S. PATENT DOCUMENTS

| | | | | |
|---|---|---|---|---|
| 2013/0064969 A1* | 3/2013 | Inoue | .................... | C23C 14/042 |
| | | | | 427/66 |
| 2014/0377903 A1* | 12/2014 | Takeda | .................. | C23C 14/042 |
| | | | | 438/99 |
| 2015/0017759 A1* | 1/2015 | Hirobe | .................... | C23C 14/24 |
| | | | | 438/99 |
| 2015/0037928 A1* | 2/2015 | Hirobe | .................... | B05B 12/22 |
| | | | | 438/99 |
| 2015/0041793 A1* | 2/2015 | Chan | ....................... | H01L 51/56 |
| | | | | 257/40 |
| 2016/0322434 A1* | 11/2016 | Ghosh | ................. | H01L 27/3218 |
| 2018/0119268 A1* | 5/2018 | Kawato | ................... | H01L 51/50 |
| 2018/0138408 A1* | 5/2018 | Lassiter | ............. | H01L 51/0011 |
| 2018/0355466 A1* | 12/2018 | Mu | ......................... | C23C 14/24 |
| 2019/0055640 A1* | 2/2019 | Sakio | .................... | C23C 14/042 |

\* cited by examiner

HIGH RESOLUTION SHADOW MASK WITH TAPERED PIXEL OPENINGS

CROSS REFERENCE TO RELATED APPLICATION

This application claims the benefit of U.S. Provisional Patent Application Ser. No. 62/580,274 filed 1 Nov. 2017 which is incorporated by reference as if set forth at length herein.

TECHNICAL FIELD

This disclosure relates generally to systems, methods, and structures for physical vapor deposition and substrate processing. More particularly, it pertains to high-resolution shadow masks having tapered pixel openings useful—for example—in preparing very-high-resolution organic light emitting displays (OLED).

BACKGROUND

Physical vapor deposition (PVD) is a known and useful technique for producing thin films, enabling the fabrication of devices such as OLEDs and photovoltaic devices including solar cells. Shadow masks are used to pattern the thin films during physical vapor deposition processes. Given their importance, improved shadow masks and/or associated methods therefore would be a welcome addition to the art.

SUMMARY

An advance in the art is made according to aspects of the present disclosure directed to systems, method, and structures including a high-resolution shadow mask with tapered aperture/pixel openings.

In sharp contrast to the prior art—systems, methods, and structures according to the present disclosure employ the high-resolution shadow mask with tapered or otherwise configured aperture/pixel openings wherein an entrance to the opening is larger than an exit and thereby advantageously overcome problems that plagued the prior art namely shadowing, fragility, and sagging.

BRIEF DESCRIPTION OF THE DRAWING

A more complete understanding of the present disclosure may be realized by reference to the accompanying drawing in which.

Figure 1:
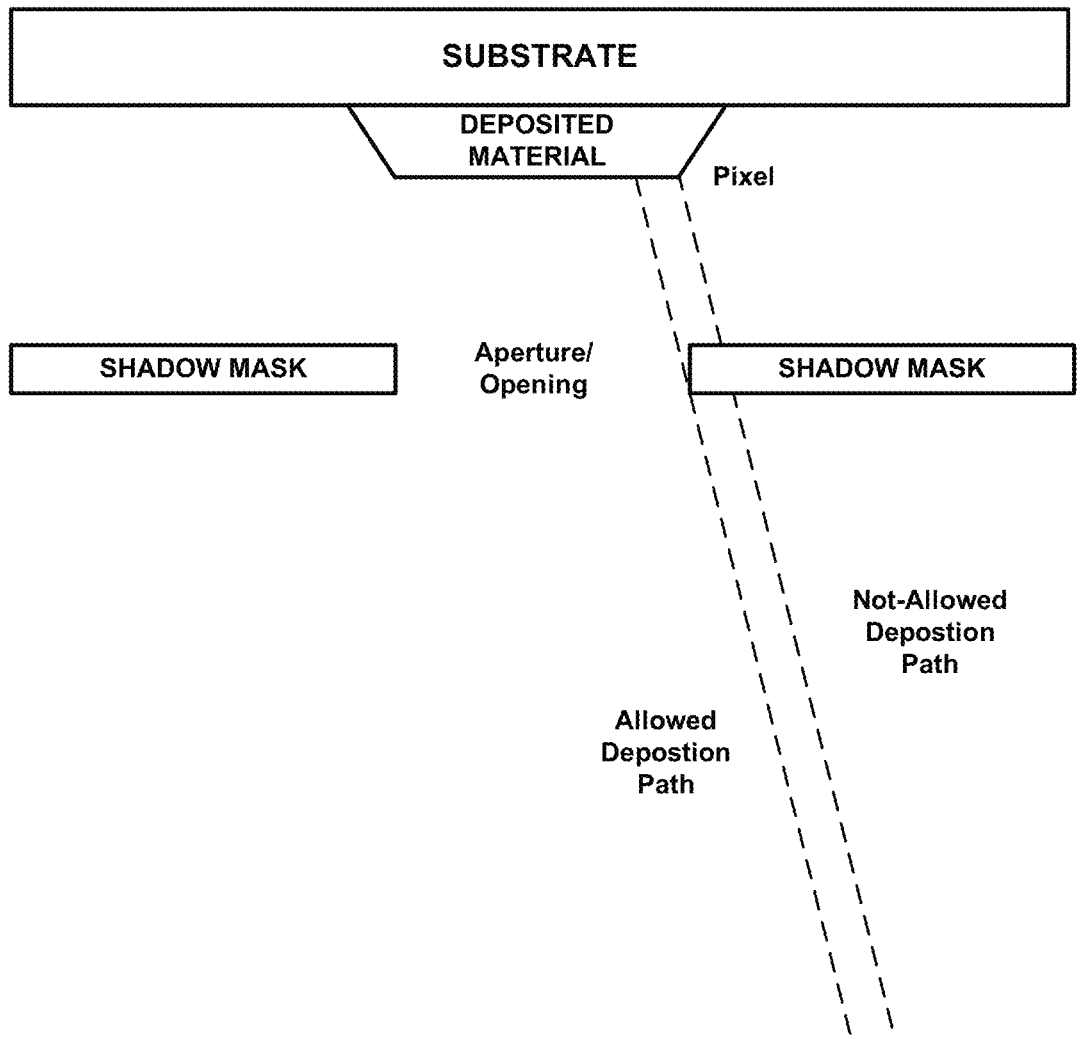
FIG. 1 is a schematic diagram illustrating the prior art resulting in blocked material at an edge of a pixel resulting in a tapered pixel profile.

The illustrative embodiments are described more fully by the Figures and detailed description. Embodiments according to this disclosure may, however, be embodied in various forms and are not limited to specific or illustrative embodiments described in the drawing and detailed description.

DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are intended to be only for pedagogical purposes to aid the reader in understanding the principles of the disclosure and the concepts contributed by the inventor(s) to furthering the art and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the FIGS. comprising the drawing are not drawn to scale.

By way of some additional background, we begin by noting that contemporary technology and applications built thereupon requires higher and higher resolution displays exhibiting increasingly smaller subpixel sizes that are already less than 3.5 micron in a shortest dimension—rapidly approaching 2 micron or even less—with less than 1 micron between subpixels.

For organic light-emitting diode (OLED) microdisplays, high resolution shadow masks have been developed for patterning individual subpixels resulting in displays exhibiting high brightness levels. As is known, shadow masks—also referred to as deposition masks or evaporation masks, are used in a wide range of vacuum-chamber evaporation and sputtering processes to fabricate both simple and complex micro-engineered electronic components and products—including displays such as OLEDs.

Operationally, and by way of illustrative example—a shadow mask is a thin sheet of material having pattern features formed completely through the material. The shadow mask is placed between a substrate and a thin film source—typically in a vapor deposition process—and the thin film material is deposited through the patterned features onto a substrate.

Notwithstanding this utility and development however, such shadow mask patterning still faces many technical challenges. In illustrating such technical challenges, we describe shadow mask application to the fabrication of individual pixel elements on a larger display, i.e., an OLED.

One such challenge is that the "body" of the mask blocks incoming organic materials at edges of the pixel opening such that a shadow or tapering of the pixel profile is formed at the edge of the pixel. FIG. 1 is a schematic diagram illustrating how material to be deposited onto a substrate via shadow mask pattern is blocked or otherwise changed at the edge of pattern feature(s). In this illustrative example—and generally throughout this disclosure—we describe such shadow mask operation with respect to display pixels such as those comprising OLED microdisplays.

In that illustrative example shown schematically in FIG. 1, the blocking of the deposited material at the edge of a pixel results in a tapered pixel cross-sectional profile.

For OLED displays exhibiting lower resolution(s) and large(r) spaces between pixels, those skilled in the art will understand and appreciate a layout can be designed such that shadowed portions of the deposition occurs off of the anode and therefore is not part of the light emitting structure. Unfortunately, however, as the pixel size and spacing between pixels is reduced to allow for high resolution and high-performance displays, this shadowed region begins to encroach into the OLED structure so that the thickness of the OLED layers is non-uniform across the subpixel. This in turn can lead to non-uniform light emission, diminished performance and reduced lifetime of the display.

Figure 2:
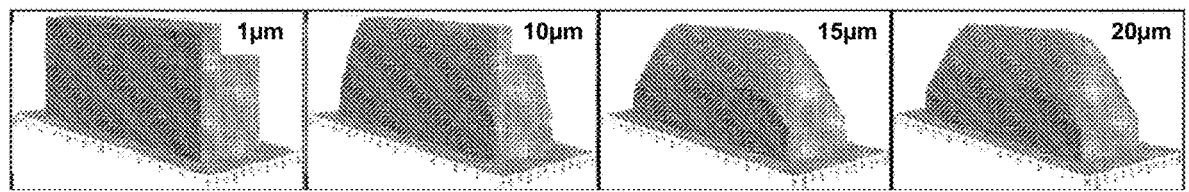
FIG. 2 is a simplified graphical illustration of a series of simulation results showing a shadow mask of varying thickness having dimensions of 2.45 micron by 8.85 micron in contact with a substrate and the resulting tapered pixel profile that results.

As will be further appreciated and understood by those skilled in the art, this non-uniform deposition scales and becomes more problematic with the thickness of the mask. Turning now to FIG. 2, there is illustratively shown a series of simulation results showing how variations in shadow mask thickness affect the deposition of deposited material onto a substrate.

As illustrated in that figure, a shadow mask with a 2.45 micron by 8.85-micron opening (aperture) having a thickness of 1 micron, 10 micron, 15 micron, and 20 micron is shown.

In this simulation, a scanned linear source deposits material through the 2.45 micron by 8.85 micron shadow mask opening onto a surface of the substrate. As the mask gets thicker, the deposited subpixel profile gets more and more shadowed. As may be observed from this figure, significant shadowing occurs with shadow mask thicknesses exceeding 1 micron. For the thickest masks shown, the thickness of the deposited material varies across the entire subpixel. Those skilled in the art will readily understand that such thickness variation in subpixels significantly impact performance negatively.

Accordingly, to minimize the shadowed region area it is generally believed necessary to use of an extremely thin shadow mask, preferably 1 micron or thinner. However, these thin shadow masks are extremely fragile and may sag, making their use in manufacturing quite challenging.

Note that the various sized openings used in our illustrative examples are just that—illustrative. Those skilled in the art will understand and appreciate that a wide range of thicknesses and opening sizes of shadow masks are contemplated by this disclosure and as such are not limited to the specific illustrative examples presented.

Accordingly, the present disclosure describes systems, methods, and structures employing a high-resolution shadow mask for OLED microdisplays (or other applications) that benefit from subpixel sizes of approximately <10 microns. Such shadow masks—according to the present disclosure—advantageously employ a tapered pixel opening and/or exhibit a multilayer structure with at least two different dimensions for different layers of the same opening.

Figure 3A:
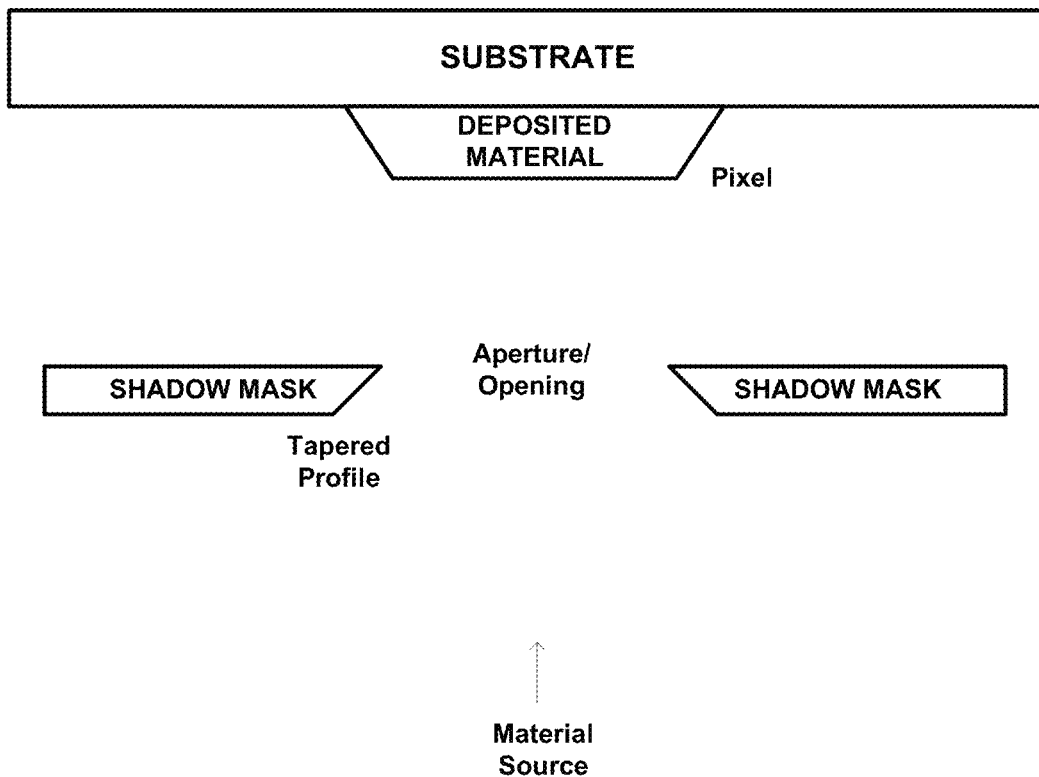
FIG. 3(A) is a schematic diagram illustrating a shadow mask having a tapered opening according to aspects of the present disclosure.
Figure 3B:
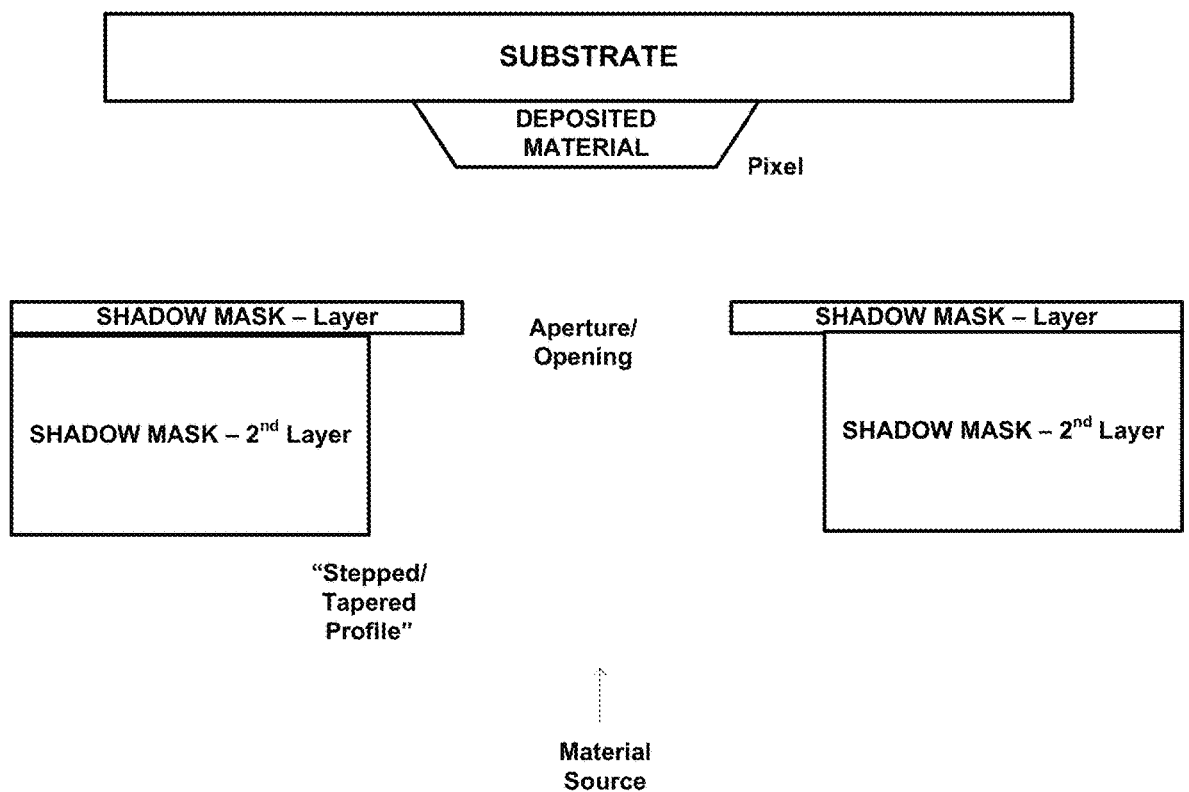
FIG. 3(B) is a schematic diagram illustrating a bi-layer shadow mask having different dimensions for each of the two layers exhibiting a stepped profile according to aspects of the present disclosure.
Figure 3C:
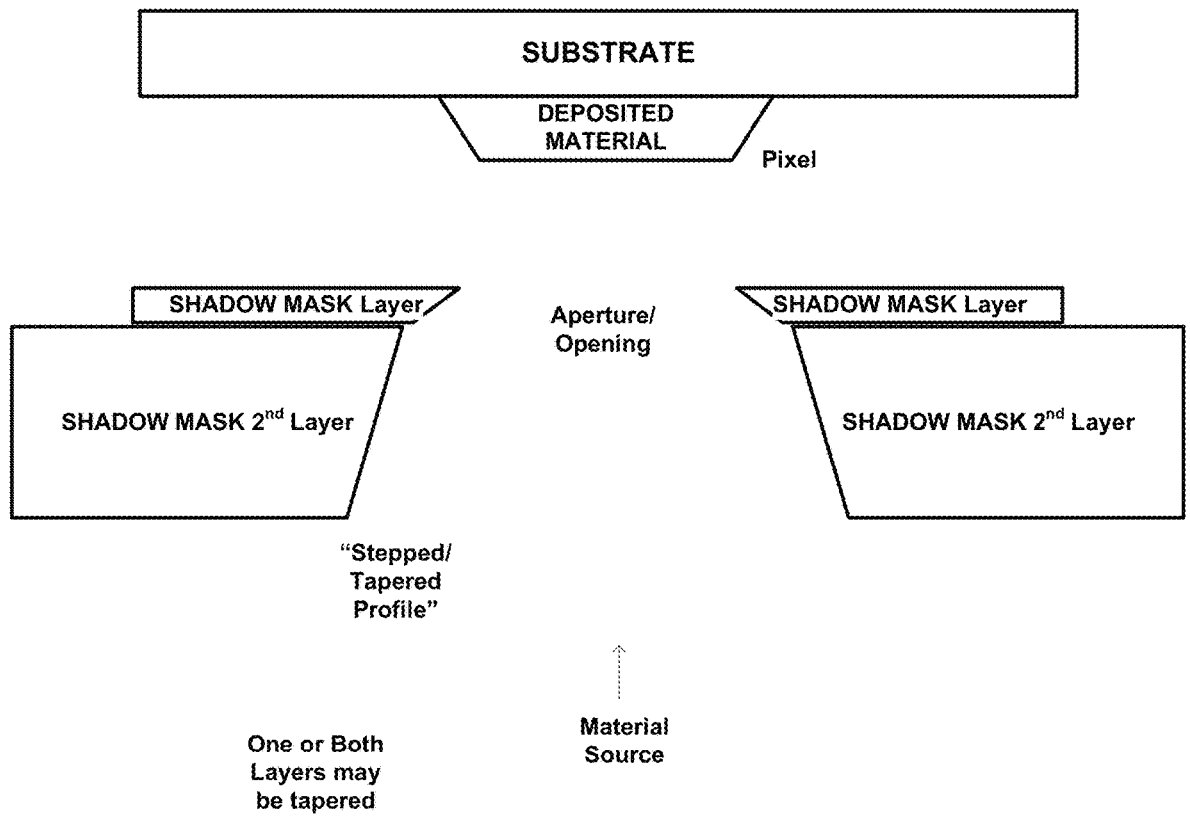
FIG. 3(C) is a schematic diagram illustrating a bi-layer shadow mask having different dimensions for each of the two layers wherein one or more exhibit a tapered profile according to aspects of the present disclosure.

Turning now to FIG. 3(A) and FIG. 3(B) and FIG. 3(C) shown therein are illustrative shadow masks according to aspects of the present disclosure. Also shown is a substrate onto which is deposited evaporated material.

In operation, the shadow mask is positioned between the substrate and an evaporative source—not specifically shown. The distance between the shadow mask and the substrate is variable according to application and the specific features/structures to be deposited on the substrate. As may be appreciated and understood by those skilled in the art, evaporated material is directed or drawn to the substrate and passes through openings formed in the shadow mask. The evaporated material that so passes is deposited on the substrate—exhibiting a shape that substantially defined by the shadow mask opening.

As illustratively shown in FIG. 3(A)—according to the present disclosure—openings in the shadow mask are formed with a tapered cross sectional profile. That is to say, one side of the opening—the side closest to the substrate—is slightly smaller than the side closest to the evaporative source (further away from the substrate). In this manner, shadow masks constructed according to the present disclosure advantageously reduce the effect of shadowing of evaporated materials while permitting thicker shadow masks. Accordingly, the fragility and sagging that plagues the prior art is advantageously overcome.

In operation, when the shadow mask is so shaped and positioned between the evaporative source and the substrate, the evaporated material passes through the tapered shadow mask by entering the larger-sized opening and exiting the smaller-sized opening and is then deposited onto the substrate. When so constructed and positioned, a greater flux of evaporated material from off-axis angles reaches the substrate thereby improving the thickness uniformity from center-to-edge of the deposited material—i.e, a pixel—without allowing additional material to "feather" outside of a defined region—i.e., the opening dimension. Generally—and according to further aspects of the present disclosure, the shadow mask opening dimensions closest to the substrate defines the size/shape of the feature(s)/structure(s) deposited thereon.

We note at this point that according to aspects of the present disclosure—and as will be readily appreciated by those skilled in the art—when the shadow mask opening is tapered or otherwise structured according to aspects of the present disclosure—the thickness of the shadow mask may be increased—so long as the general taper shape is maintained throughout the entire thickness. As noted before, this allows for a much stronger, mechanically stable shadow mask that is less prone to breaking and/or sagging. Advantageously, such continuous taper profile such as that shown in the figure and according to an aspect of the present disclosure may be formed in the shadow mask during its fabrication through any of a variety of known fabrication processes including controlled etching of the shadow mask opening.

FIG. 3(B) shows yet another configuration according to aspects of the present disclosure in which a multi-layer shadow mask is illustratively shown. In that figure, the multi-layer shadow mask includes a first layer—positioned closest to the substrate—is relatively thin and defines the opening which—in this illustrative configuration—may define a subpixel. One or more additional layer(s)—overlying the first layer—may be made much thicker (relative to the first layer) and have opening(s) larger than that formed in the first layer. When so configured and constructed, the additional layer(s) provide rigidity while still providing a gradual, somewhat tapered—albeit stepped, overall cross-sectional opening. While not exactly tapered as shown—the larger openings are larger by an amount of 1-2 microns such that a greater flux of evaporated material will reach the substrate yet still reduce a shadowed region of the subpixel being deposited. This second layer may exhibit a tapered cross-sectional profile but need not be so. In this manner, the opening is somewhat "stepped", while still having a greater opening nearer the evaporative source and a somewhat smaller opening closest to the substrate. Advantageously, such structures may be constructed by any of a variety of known fabrication processes and materials including multiple etchings with different selectivity/etch rates for the different layers—and different materials constructing the layers. Such contemplated processes include a partial wet etch followed by a DRIE etch using photolithography with an undercut layer or any of a variety of other, known patterning techniques. FIG. 3(C) shows an illustrative configuration wherein one or more of the layers exhibit a tapered cross-sectional profile in addition to the stepped tapered profile of FIG. 3(B).

At this point, while we have presented this disclosure using some specific examples, those skilled in the art will recognize that our teachings are not so limited. Accordingly, this disclosure should be only limited by the scope of the claims attached hereto.

The invention claimed is:

1. A high-resolution shadow mask for organic light-emitting diode (OLED) microdisplays comprising:
    a shadow mask body including one or more two-dimensional openings formed therein;
    the shadow mask CHARACTERIZED IN THAT at least one of the one or more openings exhibits a tapered cross-sectional profile;
    the one or more openings that exhibit a tapered cross-sectional profile that has an entrance side having a first cross-sectional area and an exit side having a second cross-sectional area, wherein the first cross-sectional area is greater than the second cross-sectional area;
    the shadow mask is formed in at least two individual layers wherein a first layer defines the exit side and a second layer defines the entrance side, and wherein the first layer has a thickness that is equal to or less than 1 micron;
    the first and second layers exhibit a different thickness relative to one another;
    the first and second layers comprise different materials relative to one another; and
    wherein the tapered cross-sectional profile has a minimum cross-sectional dimension at the exit side of the first layer, a maximum cross-sectional dimension at the entrance side of the second layer, and an intermediate cross-sectional dimension at an interface between the first and second layers, the intermediate cross-sectional dimension being greater than the minimum cross-sectional dimension and less than the maximum cross-sectional dimension; and wherein, when the shadow mask is positioned between a substrate and an evaporative source, the entrance side is closest to the evaporative source and the exit side is closest to the substrate;
    wherein the difference between the minimum cross-sectional dimension and the maximum cross-sectional dimension is between 1 and 2 microns.

2. The high-resolution shadow mask of claim 1 wherein the exit side is 10 microns or less in length along the cross-sectional dimension.

3. The high-resolution shadow mask of claim 1 wherein the exit side exhibits a cross-section having a diameter of 10 microns or less.

4. The high-resolution shadow mask of claim 1 wherein the one or more openings have a stepped tapered cross-sectional profile.

5. The high-resolution shadow mask of claim 1 wherein the second layer is thicker than the first layer.

6. A high-resolution shadow mask for organic light-emitting diode (OLED) microdisplays comprising:
    a shadow mask body including a two-dimensional aperture opening having a first tapered cross-sectional profile, said aperture opening having an entrance side and an exit side;
    wherein, when the shadow mask is positioned between a substrate and an evaporative source, the entrance side is closest to the evaporative source and the exit side is closest to the substrate;
    wherein the exit side exhibits a cross-sectional area that is less than the cross-sectional area of the entrance side;
    wherein the shadow mask body comprises multiple layers, and wherein the exit side is formed in a first one of the layers and the entrance side is formed in a second one of the layers, and wherein the first one of the layers has a thickness that is no greater than 1 micron;
    wherein the multiple layers comprise different material compositions relative to one another;
    wherein at least one of the layers exhibits a second tapered cross-sectional profile defining a portion of the aperture opening;
    wherein the first tapered cross-sectional profile has a minimum cross-sectional dimension at the exit side of the first layer, a maximum cross-sectional dimension at the entrance side of the second layer, and an intermediate cross-sectional dimension at an interface between the first and second layers, the intermediate cross-sectional dimension being greater than the minimum cross-sectional dimension and less than the maximum cross-sectional dimension; and
    wherein the difference between the minimum cross-sectional dimension and the maximum cross-sectional dimension is between 1 and 2 microns and the exit side is 10 microns or less in length along at least one cross-sectional dimension.

7. The high-resolution shadow mask of claim 6 wherein the exit side exhibits a cross-section having a diameter of 10 microns or less.

8. The high-resolution shadow mask of claim 6 wherein the one or more aperture openings have a stepped tapered cross-sectional profile.

9. The high-resolution shadow mask of claim 6 wherein the first and second layers exhibit a different thickness relative to one another.

10. The high-resolution shadow mask of claim 9 wherein the second layer is thicker than the first layer.

11. A method for depositing a material on a substrate, the method employing a high-resolution shadow mask for organic light-emitting diode (OLED) microdisplays including one or more two-dimensional aperture openings having a tapered cross-sectional profile between an entrance side and an exit side, the method comprising: positioning the shadow mask at a location between a material source and the substrate such that the entrance side is closest to the material source and the exit side is closest to the substrate; and
    directing the material to the substrate such that it passes through the one or more aperture openings and is deposited on the substrate;
    wherein the shadow mask is formed in at least two individual layers, and wherein a first layer defines the exit side and has a thickness that is equal to or less than 1 micron and a second layer defines the entrance side, and further wherein at least one of aperture openings exhibits a tapered cross-sectional profile such that the entrance side is positioned closer to the material source than the exit side which is positioned closer to the substrate, and the entrance side exhibits a larger cross-sectional area than the exit side;

wherein the tapered cross-sectional profile has a minimum cross-sectional dimension at the exit side of the first layer, a maximum cross-sectional dimension at the entrance side of the second layer, and an intermediate cross-sectional dimension at an interface between the first and second layers, the intermediate cross-sectional dimension being greater than the minimum cross-sectional dimension and less than the maximum cross-sectional dimension; and wherein the difference between the minimum cross-sectional dimension and the maximum cross-sectional dimension is between 1 and 2 microns.

12. The method of claim 11 wherein the exit side is 10 microns or less in length along the cross-sectional dimension.

13. The method of claim 11 wherein the exit side exhibits a cross-section having a diameter of 10 microns or less.

14. The method of claim 11 wherein the one or more aperture openings have a stepped tapered cross-sectional profile.

15. The method of claim 11 wherein the deposited material comprises a pixel component of an organic light emitting diode (OLED).

16. The method of claim 15 wherein the OLED is a display pixel of an OLED microdisplay.

17. The method of claim 11 wherein the first layer is defined by a first material composition and the second layer is defined by a second material composition, and wherein the first material composition differs from the second material composition.

18. The method of claim 17 wherein one of the first and second layers is thicker than the other one.

19. The high-resolution shadow mask of claim 18 wherein the second layer is thicker than the first layer.

* * * * *